(12) United States Patent
Matsumiya

(10) Patent No.: US 7,536,663 B2
(45) Date of Patent: *May 19, 2009

(54) METHOD AND APPARATUS FOR QUANTIFYING THE TIMING ERROR INDUCED BY AN IMPEDANCE VARIATION OF A SIGNAL PATH

(75) Inventor: Hiroshi Matsumiya, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 200 days.

This patent is subject to a terminal disclaimer.

(21) Appl. No.: 11/066,832

(22) Filed: Feb. 25, 2005

(65) Prior Publication Data

US 2006/0195806 A1    Aug. 31, 2006

(51) Int. Cl.
*G06F 17/50*    (2006.01)
*G06F 9/45*    (2006.01)

(52) U.S. Cl. ............... 716/6; 716/4; 716/5; 716/18; 703/13; 703/14; 324/512; 324/525; 324/531; 702/59; 702/66; 702/79

(58) Field of Classification Search ............ 716/4–6, 716/18; 703/13, 14; 702/59, 66, 79; 324/512, 324/525, 531
See application file for complete search history.

(56) References Cited

U.S. PATENT DOCUMENTS

| | | | | |
|---|---|---|---|---|
| 5,343,503 A * | 8/1994 | Goodrich | ............ | 375/377 |
| 5,528,166 A * | 6/1996 | Iikbahar | ............ | 326/27 |
| 6,509,811 B2 * | 1/2003 | Klein et al. | ............ | 333/156 |
| 6,530,062 B1 * | 3/2003 | Liaw et al. | ............ | 716/2 |
| 6,571,376 B1 * | 5/2003 | Levin et al. | ............ | 716/5 |
| 6,609,077 B1 * | 8/2003 | Brown et al. | ............ | 702/117 |
| 6,751,782 B2 * | 6/2004 | Levin et al. | ............ | 716/1 |
| 6,842,011 B1 * | 1/2005 | Page et al. | ............ | 324/637 |
| 7,003,043 B2 * | 2/2006 | Casper et al. | ............ | 375/257 |
| 7,036,098 B2 * | 4/2006 | Eleyan et al. | ............ | 716/4 |
| 7,134,101 B2 * | 11/2006 | Liaw et al. | ............ | 716/2 |
| 7,299,438 B2 * | 11/2007 | Hosono | ............ | 716/6 |
| 2001/0049812 A1 * | 12/2001 | Lutkemeyer | ............ | 716/6 |

OTHER PUBLICATIONS

Sylvester et al., A Library Compactible Driver Output Model for ON-Chip RLC Transmission Lines, Jan. 2004, IEEE, vol. 23, pp. 128136.*

* cited by examiner

*Primary Examiner*—Thuan Do
*Assistant Examiner*—Nghia M Doan
(74) *Attorney, Agent, or Firm*—Holland & Hart, LLP

(57) ABSTRACT

In one embodiment, a plurality of signals are sequentially driven onto a signal path. Each of the signals has a pulsewidth defined by a trigger edge and a sensor edge, and at least some of the signals having different pulsewidths. After driving each signal, the signal is sampled at or about a timing of the signal's sensor edge to thereby characterize the signal's sensor edge. The sensor edge characterizations corresponding to the different signals are then analyzed to quantify a timing error induced by an impedance variation of the signal path.

20 Claims, 8 Drawing Sheets

METHOD AND APPARATUS FOR QUANTIFYING THE TIMING ERROR INDUCED BY AN IMPEDANCE VARIATION OF A SIGNAL PATH

BACKGROUND

Impedance variations in signal paths induce signal reflections and delays. While TDR (time domain reflectometer) tests may be performed on single signal paths to measure impedance mismatches, they fail to measure the timing error caused by the mismatches. Furthermore, mathematical estimates of timing error from TDR data are both time consuming and imprecise.

SUMMARY OF THE INVENTION

In one embodiment, a method comprises sequentially driving a plurality of signals onto a signal path. Each of the signals has a pulsewidth defined by a trigger edge and a sensor edge, and at least some of the signals having different pulsewidths. After driving each signal, the signal is sampled at or about a timing of the signal's sensor edge to thereby characterize the signal's sensor edge. The sensor edge characterizations corresponding to the different signals are then analyzed to quantify a timing error induced by an impedance variation of the signal path.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 1:
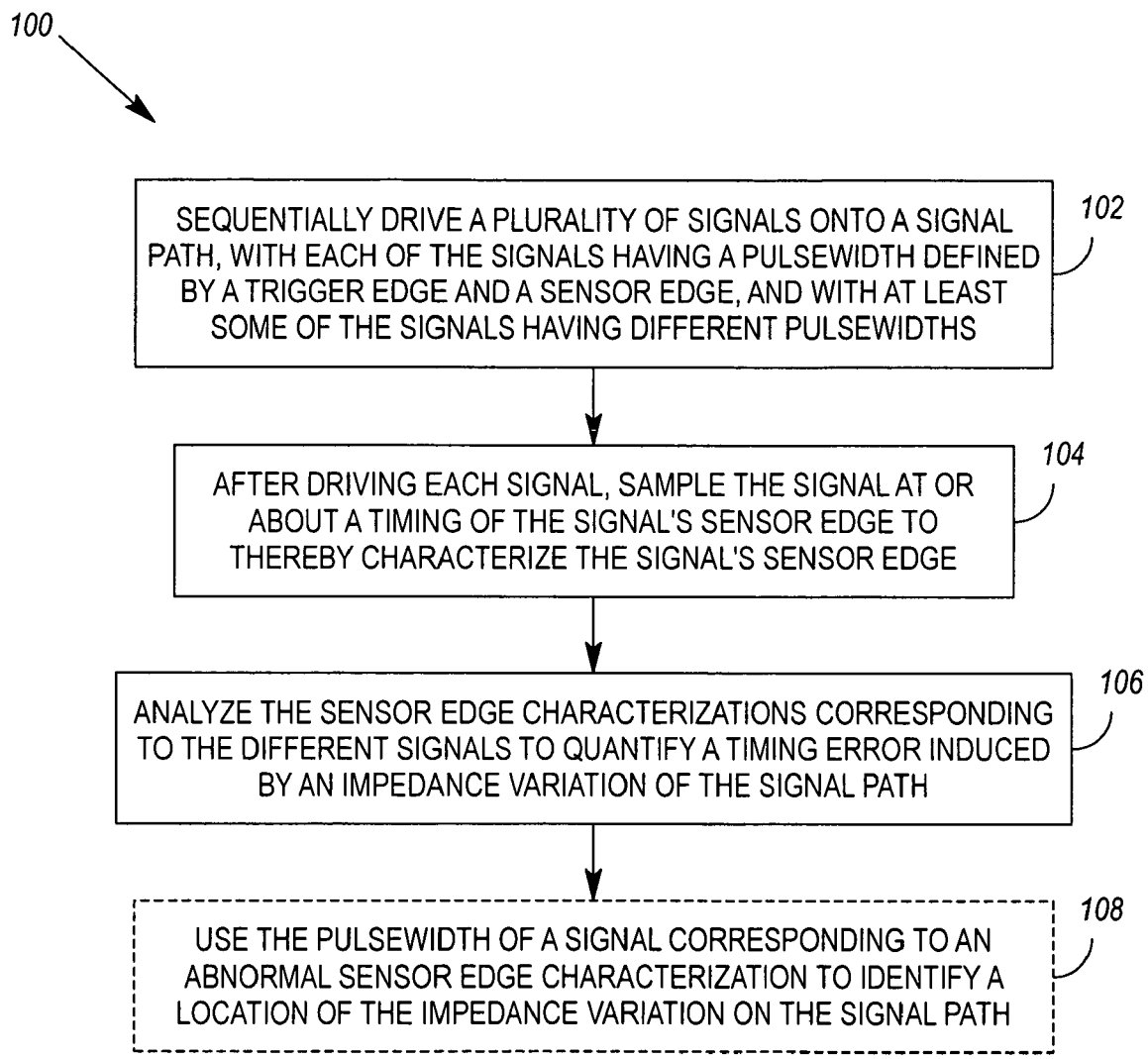
FIG. 1 illustrates a first exemplary method for quantifying the timing error induced by an impedance variation of a signal path.

FIG. 1 illustrates an exemplary method 100 for quantifying the timing error induced by an impedance variation of a signal path. The method 100 comprises sequentially driving 102 a plurality of signals onto a signal path. Each of the signals has a pulsewidth defined by a trigger edge and a sensor edge, and at least some of the signals are provided with different pulsewidths. After driving each signal, the signal is sampled 104 at or about a timing of the signal's sensor edge to thereby characterize the signal's sensor edge. The sensor edge characterizations corresponding to the different signals are then analyzed 106 to quantify a timing error induced by an impedance variation of the signal path.

Figure 2A:
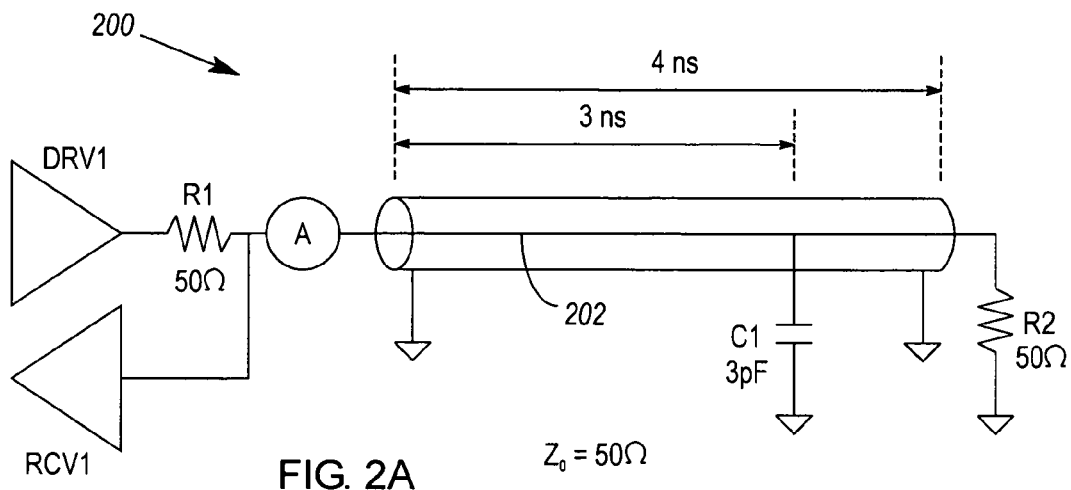
FIGS. 2A, 2B and 2C illustrate exemplary impedance variations in variously terminated signal paths.
Figure 2B:
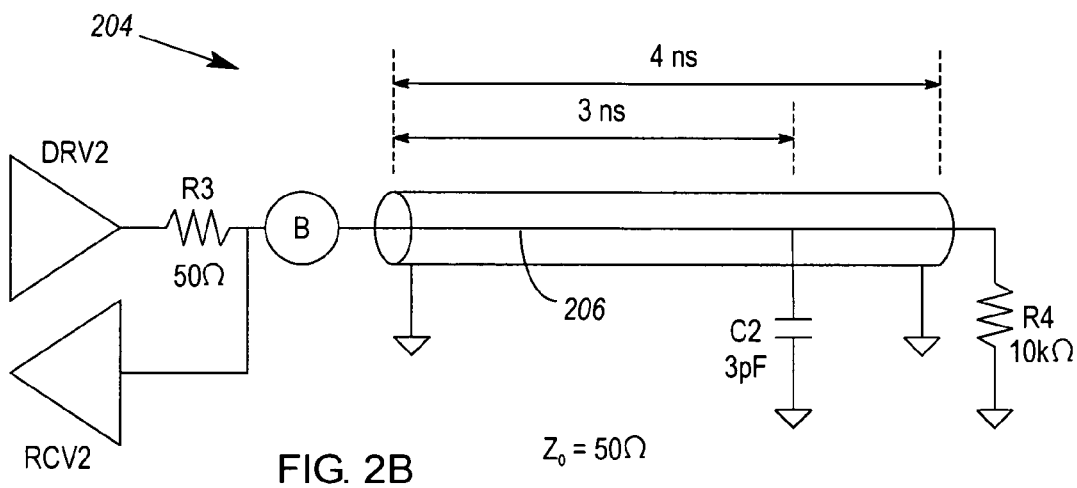
Figure 2C:
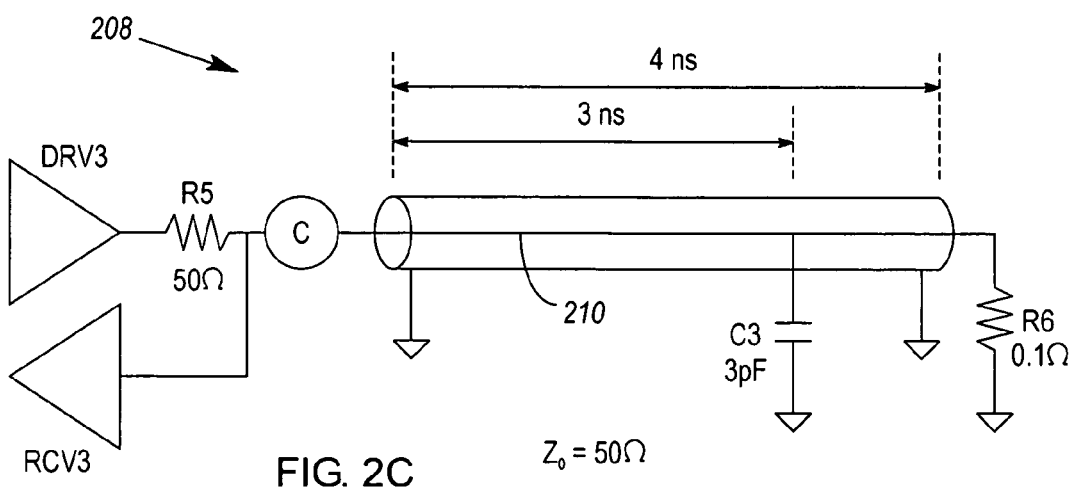

FIGS. 2A, 2B and 2C illustrate a plurality of circuits 200, 204, 208 to which the method 100 may be applied. Each of the circuits 200, 204, 208 is similarly configured, but for the manner in which a signal path 202, 206, 210 (e.g., a transmission line) of the circuit is terminated. That is, each circuit 200, 204, 208 comprises a signal path 202, 206, 210 of similar length and characteristic impedance ($Z_0$); a similar impedance variation (i.e., a 3 picofarad (pF) capacitance C1, C2, C3), similarly situated along the signal path 202, 206, 210; and a driver (i.e., DRV1, DRV2, DRV3) and receiver (i.e., RCV1, RCV2, RCV3) coupled to one end of the circuit's signal path 202, 206, 210. The signal path 202 is terminated to ground by an impedance R2 that is matched to impedance R1). The signal path 206 is terminated to ground by a 10 kiliohm (kΩ) resistor R4, essentially giving it an open termination. The signal path 210 is terminated to ground by a 0.1Ω resistor R6, essentially giving it a short termination.

The signal paths 202, 206, 210 may represent, for example, different channels of automated test equipment (ATE). As a result, each signal path 202, 206, 210 may comprise various traces, cables, and connectors of an instrument, load board, probe card, cables, et cetera. In one embodiment, the impedance variations C1, C2, C3 represent the impedance of a connector.

The length of each signal path 202, 206, 210 may be characterized in terms of the time it takes a signal to propagate the length of the signal path. By way of example, each signal path 202, 206, 210 is shown to have a length of 4 nanoseconds (ns), with the impedance variations C1, C2, C3 occurring at 3 nanoseconds (ns). For simplicity, each signal path 202, 206, 210 is shown to have only one impedance variation. However, a signal path could have more or less impedance variations. The impedance variations could also take other forms (such as resistive, inductive or mixed forms).

Figure 3A:
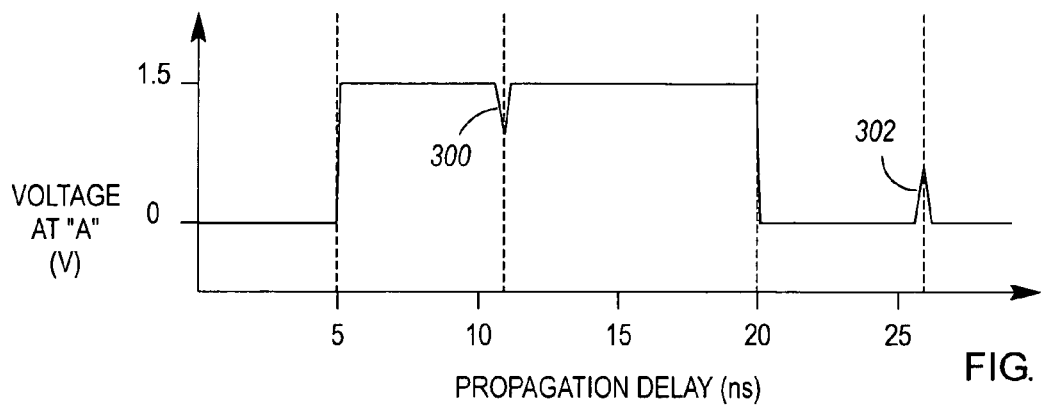
FIGS. 3A, 3B and 3C illustrate respective, exemplary signal reflections induced by the impedance variations of the variously terminated signal paths shown in FIGS. 2A, 2B and 2C.
Figure 3B:
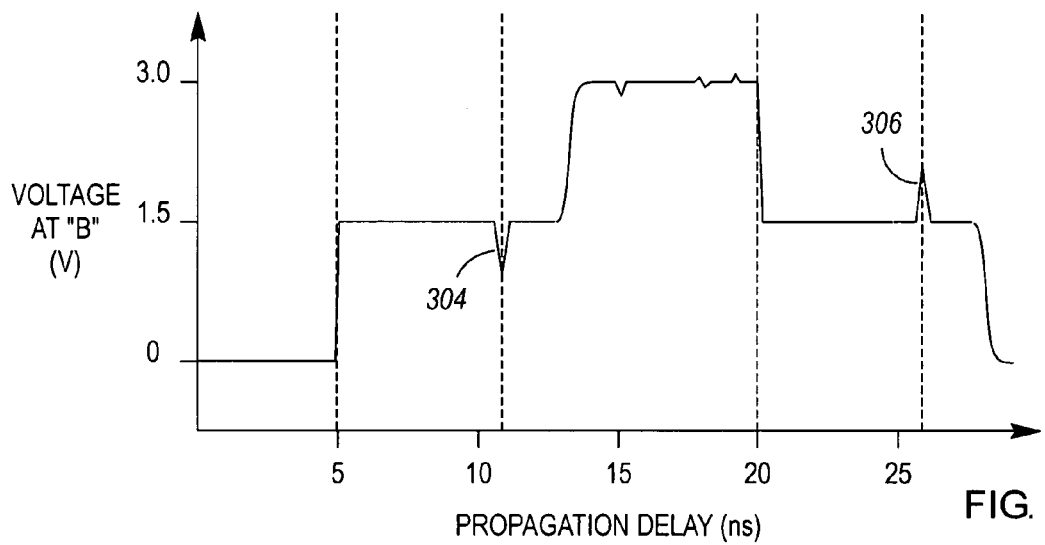
Figure 3C:
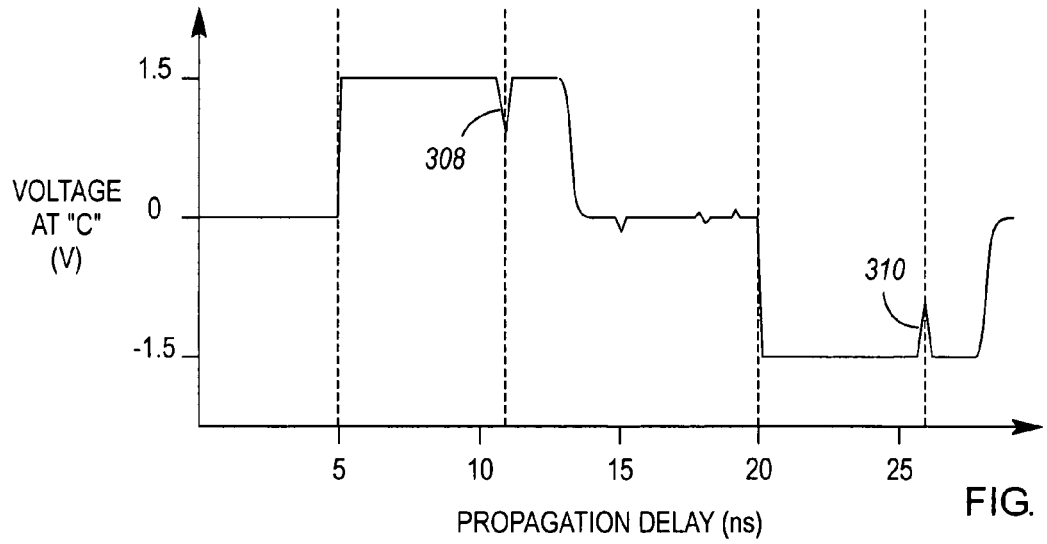

FIGS. 3A, 3B and 3C illustrate the driving of a signal onto each of the signal paths 202, 206, 210. By way of example, the driven signal is a waveform having a 30 ns period and 50% duty cycle (i.e., a 15 ns pulsewidth), rising from zero to 3 volts (V) in 0.3 ns, and falling from 3V to zero in 0.3 ns. As shown, the impedance variations C1, C2, C3 induce signal reflections 300, 302, 304, 306, 308, 310 of approximately 0.4V, 6 ns after the rising and falling edges of the signal are driven onto the signal paths 202, 206, 210. This is so regardless of the manner in which the various signal paths 202, 206, 210 are terminated. The waveforms sampled at observation points A, B and C (by receivers RCV1, RCV2 and RCV3; see FIG. 2) do, however, vary in shape and voltage.

Figure 4:
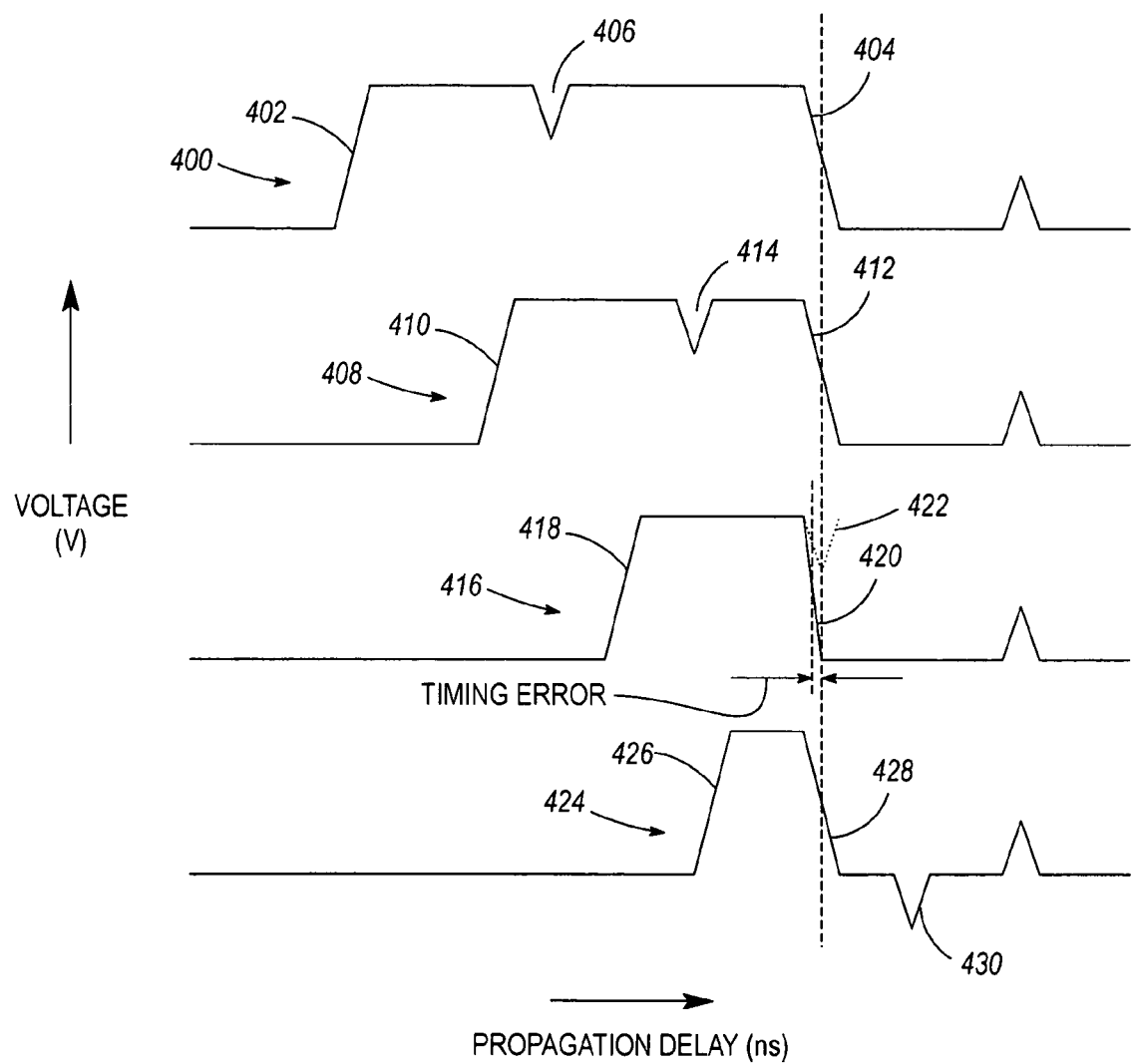
FIG. 4 illustrates a set of exemplary signals, each having a different pulsewidth, that may be driven onto a signal path in accordance with the method shown in FIG. 1.

In applying the method 100 to the signal paths 202, 206, 210 shown in FIG. 2, the plurality of signals 400, 402, 404, 406 shown in FIG. 4 may be sequentially driven onto one or all of the signal paths 202, 206, 210. For the remainder of this description, only signal path 202 will be considered.

As shown, each of the signals 400, 408, 416, 424 has a different pulsewidth, with each pulsewidth being defined by a trigger edge 402, 410, 418, 426 and a sensor edge 404, 412, 420, 428. The different pulsewidths may be formed by, for example, adjusting the timing of the signals' trigger edges, sensor edges, or both. For signals 400 and 408, the reflection 406, 414 caused by impedance variation C1 (FIG. 2) occurs prior to the timing of the signal's sensor edge 404, 412, and for signal 424, the reflection 430 occurs after. However, for signal 416, the reflection 422 (shown in phantom) coincides with the timing of the signal's sensor edge 420, thereby causing a change in the sensor edge 420 as perceived at observation point A. For example, both the midpoint and slope of the sensor edge 420 have been altered by the overlap of reflection 422 on the sensor edge 420.

Figure 5:
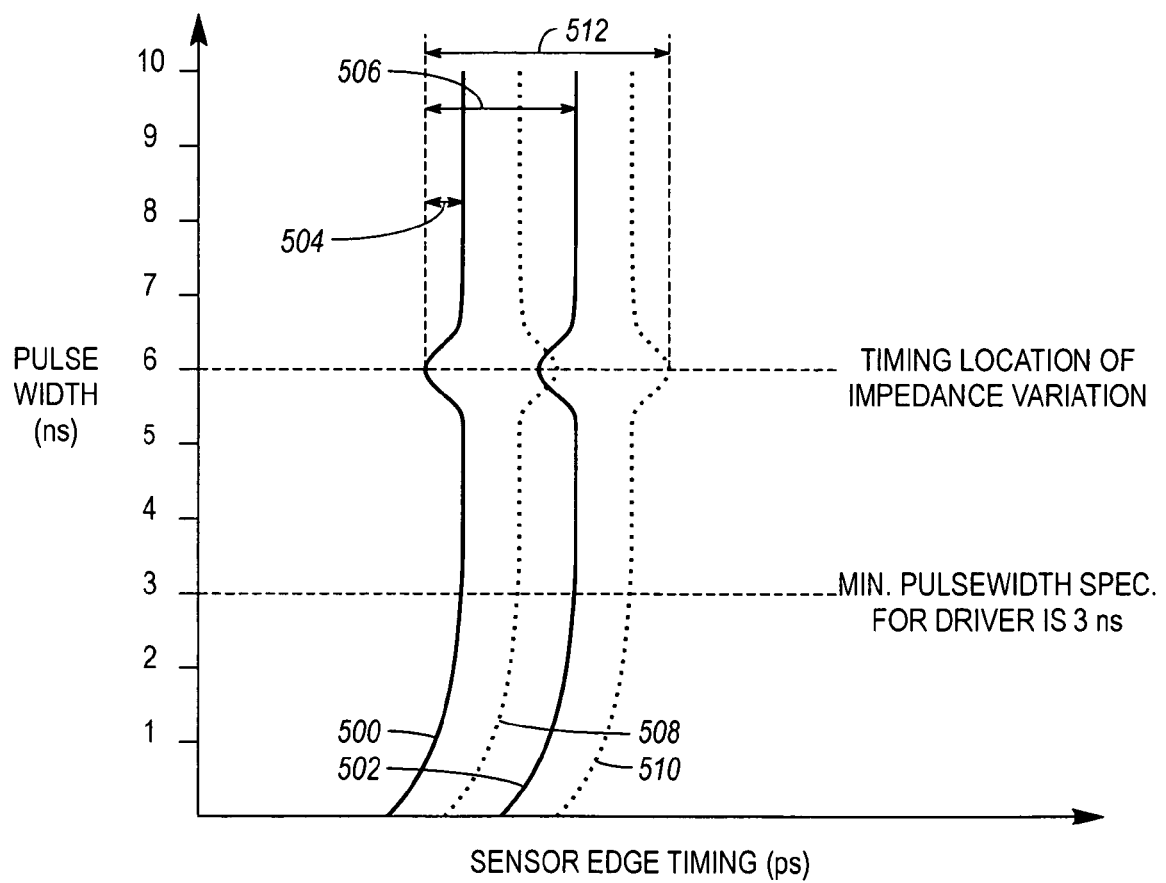
FIG. 5 illustrates an exemplary graphical representation of measured sensor edge data.

The sensor edges of signals having different pulsewidths, as observed at point A of the signal path 202, may be plotted as shown in FIG. 5, wherein plot 500 represents the midpoints of various sensor edges observed at point A as signals having different pulsewidths are driven onto signal path 202. The variation 504 or abnormality in sensor edge timing for a signal having a 6 ns pulsewidth indicates that, when driving a signal having a pulsewidth of 6 ns onto the signal path 202, the reflection caused by impedance variation C1 overlapped the sensor edge of the signal. The amount of the sensor edge variation represents the timing error induced by the impedance variation. The pulsewidth of the signal that enabled sensing of the timing error (i.e., 6 ns) can be used 108 (FIG. 1) to identify where on the signal path 202 the timing error is induced. That is, since the trigger edge of a signal has to travel from point A to the impedance variation, and then the induced reflection needs to travel back along the same route, it can be determined that the impedance variation occurs along the signal path 202 3 ns from point A (i.e., 6 ns÷2=3 ns).

As previously mentioned, a signal's sensor edge may be characterized by a receiver (e.g., RCV1, RCV2 or RCV3) in terms of the midpoint of the sensor edge. The midpoint of a signal's sensor edge may be found by, for example, sampling the signal (e.g., sampling its voltage) at a plurality of points extending from before its sensor edge to at least the midpoint of its sensor edge. The midpoint of a signal's sensor edge may also be found by sampling the signal at a plurality of points extending from after its sensor edge to at least the midpoint of its sensor edge. In some cases, it may be desirable to determine the midpoint of a signal's sensor edge in both of these ways—that is, by sampling it from the left and from the right. In FIG. 5, the plot 500 represents early timings of sensor edges (i.e., based on their sampling from the left), and the plot 502 represents late timings of sensor edges (i.e., based on their sampling from the right). The variation or comparison 506 between early and late timings represents a peak-to-peak timing error associated with an impedance variation.

Figure 6:
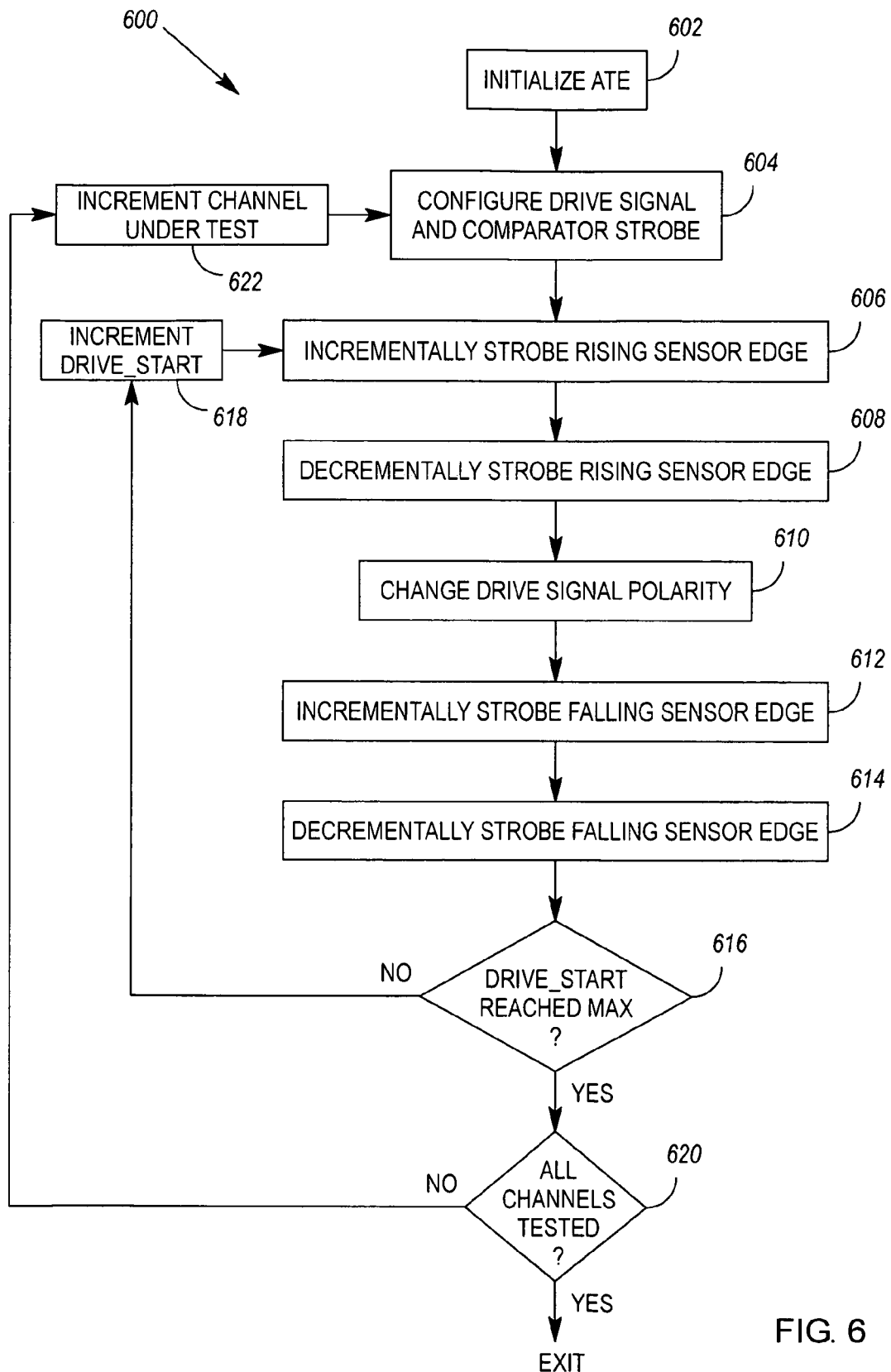
FIG. 6 illustrates a second exemplary method for quantifying the timing error induced by an impedance variation of a signal path.

FIG. 6 illustrates how the method 100 may be applied to Agilent Technology, Inc.'s Versatest Series Model V4xxx ATE. However, it is noted that the method 100 is applicable to a wide variety of test and measurement equipment. Agilent Technologies, Inc. is a Delaware corporation having its principal place of business in Palo Alto, Calif., USA.

One of skill will recognize that any portion of the ATE's signal paths may be evaluated, including those of the ATE's loadboards, probecards, calibration boards, interface boards, cables and sockets. Also, the method 100 may be applied to each of the ATE's channels, each of which is likely to already be associated with a signal driver and a signal receiver. In some embodiments, the method 100 may be applied to environments where ATE, a loadboard and a probecard each comprise thousands of traces. In such embodiments, the method 100 may be used to identify the worst performing of the many thousands of traces, in significantly less time than can conventional methods.

Figure 7:
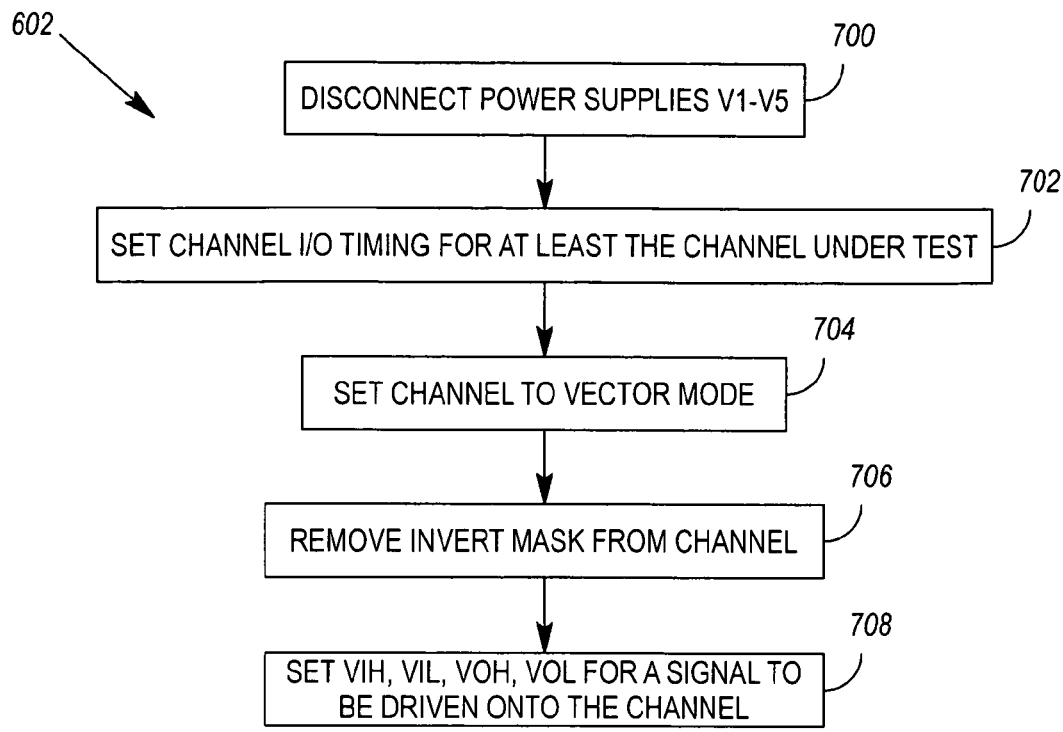
FIG. 7 illustrates an exemplary method for initializing ATE in accordance with the method shown in FIG. 6.

Proceeding now with a description of the method 600 (FIG. 6), the method begins with initialization 602 of the ATE. FIG. 7 illustrates exemplary steps that may be taken to initialize Versatest Series Model V4xxx ATE. That is, power supplies V1-V5 are disconnected 700; channel I/O (input/output) timing for at least the channel under test (hereinafter simply referred to as "the channel") is set 702; the channel is set 704 to vector mode; the invert mask is removed 706 from the channel; and high and low input voltages (VIH, VIL, VOH, VOL) are set 708 for the channel.

Figure 8:
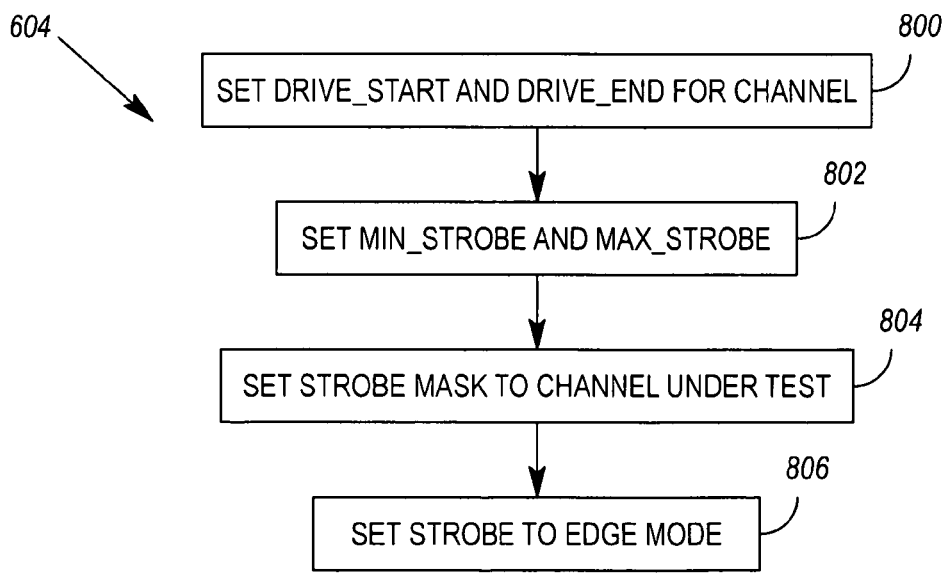
FIG. 8 illustrates an exemplary method for configuring the ATE in accordance with the method shown in FIG. 6.

Referring back to FIG. 6, the method 600 continues with drive signal and receiver strobe configuration 604. FIG. 8 illustrates exemplary steps that may be taken to do this, including setting 802 the timing of a DRIVE_START (i.e., a signal representing sensor edge timing) and a DRIVE_END (i.e., a signal representing trigger edge timing) for a signal to be driven onto the channel; setting 804 a strobe start (i.e., MIN_STROBE) and strobe end (MAX_STROBE) of a strobe used to sample the signal driven onto the channel; setting 806 a strobe mask for the channel; and setting 808 the strobe receiver to edge mode. To avoid crosstalk and other potential interference on the channel involved in the analysis, signal transmission on all of the channels but for the channel under test can be masked.

Referring back to FIG. 6 again, the method 600 continues with the incremental strobing 606 of the rising sensor edge of the signal that is driven onto the channel. That is, the driven signal is sampled in response to the strobe to characterize the sensor edge from the left. The rising sensor edge is then decrementally strobed 608 to characterize the sensor edge from the right. Thereafter, the polarity of the driven signal is changed 610, and the falling sensor edge of the new drive signal is then incrementally and decrementally strobed 612, 614.

After characterizing the rising and falling sensor edges of drive signals having a given pulsewidth but different polarities, it is determined whether a minimum pulsewidth has been reached 616. If not, the timing of the driven signals' DRIVE_START is incremented 618, and the steps 606-614 are repeated. If so, it is determined whether all channels of the ATE have been tested 620. If not, the channel under test is incremented 622 and steps 604-618 are repeated. Otherwise, the method 600 comes to an end.

Figure 9:
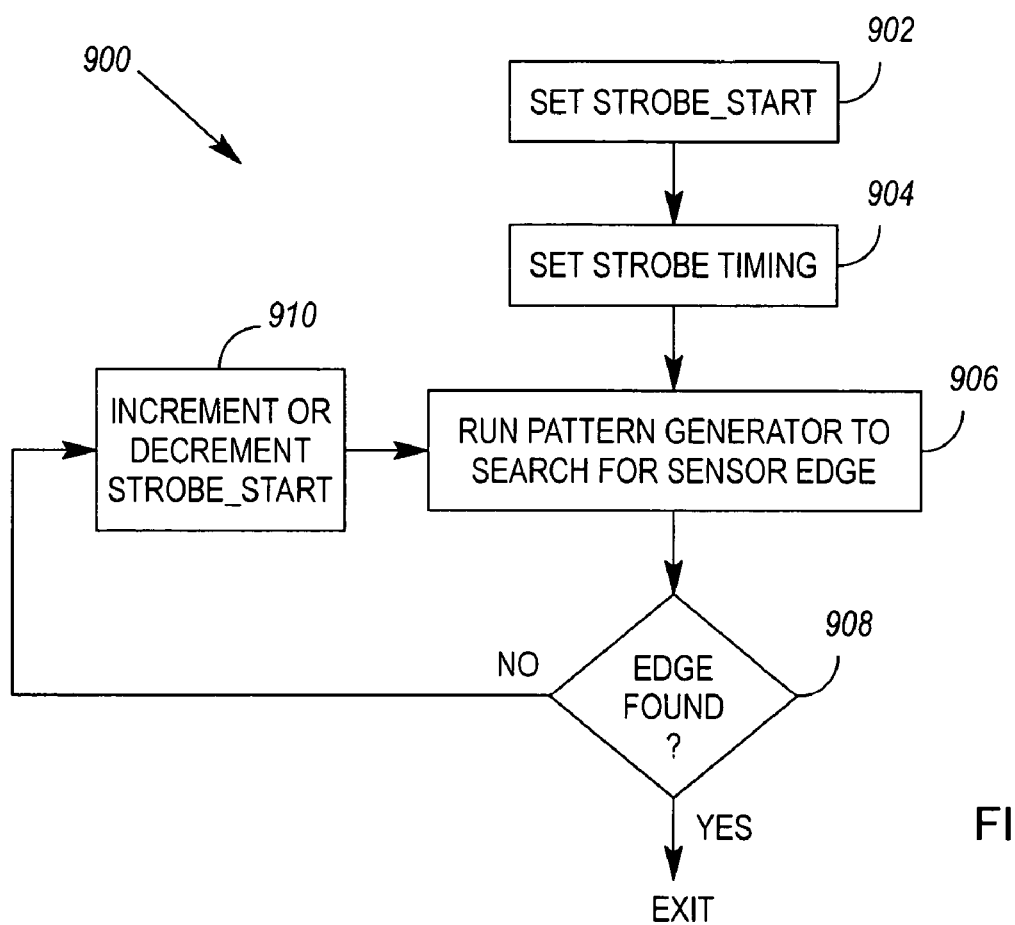
FIG. 9 illustrates an exemplary method for strobing a sensor edge of a drive signal, in accordance with the method shown in FIG. 6.

FIG. 9 illustrates an exemplary method 900 for incrementally or decrementally strobing a sensor edge in accord with any of steps 606, 608, 612, 614 of the method 600. The method 900 comprises setting 902 a STROBE_START; setting 904 the strobe timing; and running 906 a pattern generator and searching for the midpoint of a sensor edge. If the midpoint is found 908, the method 900 completes. Otherwise, the STROBE_START is incremented or decremented 910, and the pattern generator is used to search once again for the sensor edge. The threshold of the pattern generator is set to the voltage which is expected at the midpoint of a sensor edge.

When executing the method 600, the timing of DRIVE_START may be incremented over a time period equal to the propagation delay of a channel under test, or over a range of pulsewidths corresponding to a portion of a channel where an impedance variation is expected to exist. Also, STROBE_START may be incremented over a drive signal's entire period, or over a range where a drive signal's sensor edge is expected to be detected.

The data produced by mismatched impedance timing analyses may take many forms, including tables, databases, and illustrations. In some embodiments such data may be intermediate data to be utilized for further manual or automated analyses. The accuracy of the methods 100 and 600 may be improved by repeatability. For example, one may wish to loop a test vector 1000 times per channel, for example, to obtain a large enough set of data to produce a desired level of accuracy.

FIG. 5 illustrates an exemplary graphical representation (i.e. plot) of sensor edge midpoints relative to the method 600 and the signal path 202. The vertical unit of the plot is the pulsewidth (PW) of the drive signal in nanoseconds. The horizontal unit of the plot is the detected sensor edge timing in picoseconds. Line 500 represents a plot of the rising sensor edge detected by incremental strobing. Line 502 represents a plot of the rising sensor edge detected by decremental strobing. Line 508 represents a plot of the falling sensor edge detected by incremental strobing. Line 510 represents a plot of the falling sensor edge detected by decremental strobing.

Below a pulsewidth of about 3 ns, the sensor edge plots have distortions that reflect the minimum pulsewidth for which the receiver (RCV1) connected to the signal path 202 can accurately detect a sensor edge midpoint. Note, however, that this 3 ns minimum pulsewidth is exemplary only. Depending on the ATE system of which the receiver forms a part, this minimum pulsewidth may be less or greater.

FIG. 5 illustrates some, but not all, of the useful measurements that may be derived from the collected data. For example, in addition to measurements 504 and 506, which have already been discussed, the measurements comprise a peak-to-peak timing error 512 for the impedance mismatch C1, in addition to deadband. The peak-to-peak timing error 512 comprises the combined errors associated with jitter, linearity, receiver and driver errors, plus the maximum timing error caused by rising or falling edges being reflected by the impedance variation C1.

The methods described herein may be executed manually or automatically, either in full or in part. In some cases, the methods may be embodied in sequences of instructions that, when executed by a machine (e.g., ATE), cause the machine to perform the actions of the method. The sequences of instructions can be stored on a program storage device such as a fixed disk, removable disk, memory, or combination thereof, whether in a single location, or distributed across a network.

What is claimed is:

1. A method, comprising:
   sequentially driving a plurality of signals onto a signal path, each of the signals having a pulsewidth defined by a trigger edge and a sensor edge, and at least some of the signals having different pulsewidths;
   after driving each signal, i) sampling the signal at or about a timing of the signal's sensor edge, and ii) characterizing the signal's sensor edge in response to the sampling;
   analyzing the sensor edge characterizations corresponding to the different signals to identify at least one abnormality in the sensor edge characterizations; and
   quantifying, based on the at least one abnormality, a timing error induced by an impedance variation of the signal path.

2. The method of claim 1, wherein the different pulsewidths of the signals are formed by adjusting timings of the trigger edges, but not the sensor edges, of at least some of the signals.

3. The method of claim 1, wherein the different pulsewidths of the signals are formed by adjusting timings of the sensor edges, but not the trigger edges, of at least some of the signals.

4. The method of claim 1, wherein the different pulsewidths of the signals are formed by adjusting timings of both the trigger and sensor edges of at least some of the signals.

5. The method of claim 1, wherein the signal samples comprise voltages.

6. The method of claim 1, wherein each signal is sampled at a plurality of points extending from before the signal's sensor edge to at least the midpoint of the signal's sensor edge.

7. The method of claim 6, wherein each signal's sensor edge is characterized by using the plurality of sample points for the signal to determine a timing of a midpoint of the signal's sensor edge.

8. The method of claim 6, wherein each signal is further sampled at a plurality of points extending from after the signal's sensor edge to at least the midpoint of the signal's sensor edge.

9. The method of claim 8, wherein each signal's sensor edge is characterized by,
   using the plurality of sample points beginning from before the signal's sensor edge to determine an early timing of a midpoint of the signal's sensor edge; and
   using the plurality of sample points beginning from after the signal's sensor edge to determine a late timing of a midpoint of the signal's sensor edge.

10. The method of claim 9, wherein quantifying the timing error induced by the impedance variation of the signal path comprises:
    comparing plots of early and late timings of the midpoints of the signal's sensor edges to quantify a peak-to-peak timing error associated with the impedance variation.

11. The method of claim 1, wherein each signal is sampled at a plurality of points extending from after the signal's sensor edge to at least the midpoint of the signal's sensor edge.

12. The method of claim 11 wherein each signal's sensor edge is characterized by using the plurality of sample points for the signal to determine a timing of a midpoint of the signal's sensor edge.

13. The method of claim 1, further comprising, using the pulsewidth of a signal corresponding to an abnormal sensor edge characterization to identify a location of the impedance variation on the signal path.

14. The method of claim 1, wherein sequentially driving the plurality of signals onto the signal path comprises:
    driving a plurality of signals having falling sensor edges onto the signal path; and
    driving a plurality of signals having rising sensor edges onto the signal path.

15. The method of claim 1, wherein the signal path is a signal path of a circuit tester.

16. The method of claim 15, further comprising, repeating said driving, sampling, characterizing, analyzing and quantifying actions for each channel of the circuit tester.

17. The method of claim 15, wherein the impedance variation is known to be a result of a connector in the signal path, and wherein the different pulsewidths of the plurality of signals are selected to be at or around two times the time it takes the signals to propagate to the connector.

18. The method of claim 1, wherein the different pulsewidths of the plurality of signals are selected to be at or around two times the time it takes the signals to propagate to an area of the signal path where the impedance variation is expected to be.

19. A program storage device having stored thereon sequences of instructions that, when executed by a machine, cause the machine to perform the actions of:
    sequentially driving a plurality of signals onto a signal path, each of the signals having a pulsewidth defined by a trigger edge and a sensor edge, at least some of the signals having different pulsewidths;
    after driving each signal, i) sampling the signal at or about a timing of the signal's sensor edge, and ii) characterizing the signal's sensor edge in response to the sampling;
    analyzing the sensor edge characterizations corresponding to the different signals to identify at least one abnormality in the sensor edge characterizations; and
    quantifying, based on the at least one abnormality, a timing error induced by an impedance variation of the signal path.

20. The program storage device of claim 19, wherein each signal is sampled at a plurality of points on either side of its sensor edge.

* * * * *